United States Patent

[11] 3,591,855

[72] Inventors Jack Allen Dean
Flemington;
Robert Charles Heuner, Bound Brook, both of, N.J.
[21] Appl. No. 816,964
[22] Filed Apr. 17, 1969
[45] Patented July 6, 1971
[73] Assignee RCA Corporation

[54] COMPLEMENTARY FIELD-EFFECT TRANSISTOR BUFFER CIRCUIT
14 Claims, 1 Drawing Fig.

[52] U.S. Cl. 307/237, 307/241, 307/304
[51] Int. Cl. H03k 5/08
[50] Field of Search 307/237, 241, 242, 243, 251, 255, 262, 304

[56] References Cited
UNITED STATES PATENTS
3,449,594 6/1969 Gibson et al. 307/251
3,458,723 7/1969 Hanson 307/255 X
3,493,812 2/1970 Weimer 307/304 X

*Primary Examiner*—Roy Lake
*Assistant Examiner*—James B. Mullins
*Attorney*—H. Christoffersen ABSTRACT: A buffer circuit to interface between a complementary field-effect transistor (FET) circuit operated at a first voltage level and a load circuit operated at a second voltage level having a lower value than said first voltage level. The buffer includes an input stage and an output stage. The output stage includes two transistors of opposite conductivity connected in parallel to clamp the buffer output point to the positive terminal of the second power supply and a third transistor to clamp the buffer output point to the negative terminal of the second supply. The input stage includes a complementary inverter operated at the first voltage level which in response to output signals from the FET circuit generates complementary signals used to enable either the parallel combination of the two transistors or the third transistor.

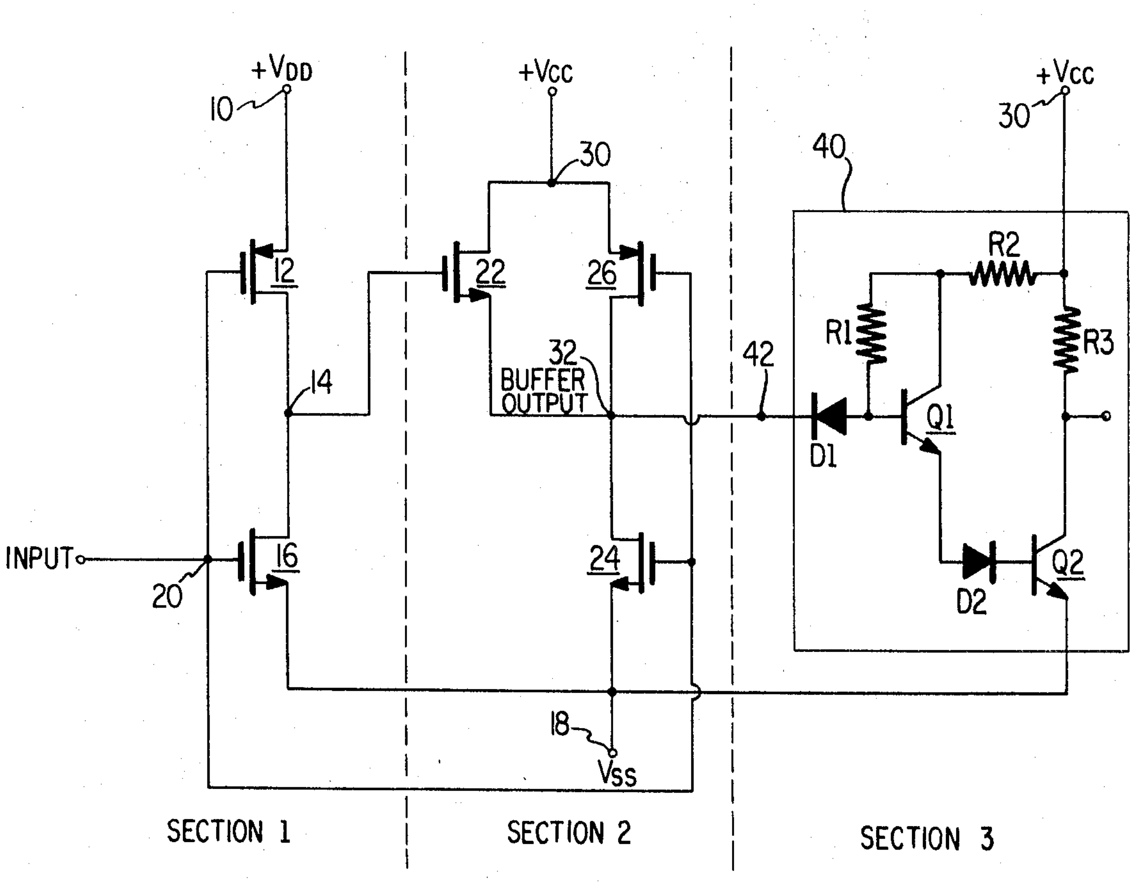
INVENTORS
Jack Allen Dean and
Robert Charles Heuner
BY [signature]
ATTORNEY

COMPLEMENTARY FIELD-EFFECT TRANSISTOR BUFFER CIRCUIT

BACKGROUND OF THE INVENTION

Field-effect transistors (FET) circuits are noted for their extremely high input impedances which permits the manufacture of very small area devices which operate at low current levels. These characteristics result in circuits which are highly efficient in their use of chip area and in the amount of power consumed. However, due to their relatively high output impedances, even when enabled, and their low current carrying (current sinking) capabilities, FET circuits have to be buffered in order to drive low-impedance, high-current circuits. In addition, low-impedance, high-current circuits usually have a lower operating voltage than the FET circuits and may be damaged if operated at the FET voltage supply levels. It is therefore required that a suitable buffer circuit be provided between an FET circuit and a low-impedance, high-current load.

The object of the present invention is to provide a buffer circuit such as described above; which is simple and utilizes few components to preserve the efficient use of chip area; which requires little or no standby power in order to maintain the low thermal dissipation of the chip; and which provides a suitable impedance match and voltage translation between the high voltage and impedance of the field-effect transistors and the low impedance and voltage of the bipolar devices.

SUMMARY OF THE INVENTION

A buffer circuit having two junction points and an output point and transistor means for coupling the junction points to the output point.

In response to input signals which have either a first value equal to a first voltage level or a second value equal to a point of reference potential said transistor means clamp the output point to either one of said two junction points. One of said two junction points being coupled to said reference potential and the other of said two junction points being coupled to a second voltage level whose value is at most equal to said first voltage level.

BRIEF DESCRIPTION OF THE DRAWING

The sole FIGURE depicts a buffer circuit embodying the invention driving a typical load.

DETAILED DESCRIPTION

The novel circuit disclosed presents a solution to the interface problem encountered when going from a field-effect transistor circuit to a load circuit characterized by a low-impedance, high-current, low voltage system such as, for example, a bipolar transistor circuit.

For ease of illustration insulated-gate field-effect transistors (IGFETS) of the enhancement type are used to illustrate the buffer circuit. However, any of the known types of field-effect transistors–e.g., depletion type IGFETS, or junction field-effect devices–may be used to practice the invention. Transistor characteristics are well known and need not be described in detail. But, for a clearer understanding of the description to follow the following definitions and characteristics pertinent to the invention are set forth:

1. The IGFETS of the enhancement type used have a first electrode and a second electrode defining a conduction path and a control electrode (gate) whose applied potential determines the conductivity of the conduction path. The first and second electrodes of an IGFET are referred to as the source and drain electrodes. For a P-type IGFET the source electrode is defined as that electrode of the first and second electrodes having the highest potential applied thereto. For an N-type device, the source electrode is defined as that electrode of the first and second electrodes having the lowest potential applied thereto.

2. For conduction to occur, the applied gate-to-source potential ($V_{GS}$) must be in a direction to forward bias the gate with respect to the source and must be greater in magnitude than a given value which is defined as the threshold voltage ($V_T$). Thus where applied $V_{GS}$ is in a direction to forward bias the transistor but is lower in amplitude than $V_T$ the transistor remains cut off and there is substantially no current in the conduction channel. In other words, if the power supply voltage does not exceed the threshold voltage ($V_T$) of the transistor it is impossible to turn the transistor "on."

3. When used as a source (or emitter) follower the voltage at the source electrode ($V_S$) "follows" the signal applied at the gate ($V_G$) but is offset with respect to the gate signal by a voltage whose amplitude is equal to the threshold voltage ($V_T$). [$V_S=V_G-V_T$]. A problem which results is that the output value of the signal at the source cannot reach the value of signal applied to the gate. These and other problems are resolved by the circuit embodying the invention.

Referring to the sole figure, it is seen that the circuit has three sections. Section 1 comprises a complementary inverter which may represent either the input stage of the Buffer chip or the output stage of a FET array. Section 2 is the voltage level translation section of the interface circuit, and Section 3 comprises a typical load which may for example be a bipolar transistor circuit.

In section 1, P-type transistor 12 has its source connected to junction point 10 to which is applied a potential $V_{DD}$ and its drain connected to output terminal 14. N-type transistor 16 has its drain connected to terminal 14 and its source connected to junction point 18 to which is applied a potential $V_{SS}$. $V_{SS}$, for ease of illustration, will be assigned the value of zero or ground potential. The gate electrodes of transistors 12 and 16 are connected in common to the signal input point 20.

Section 2 includes 3 transistors. Transistors 22 and 24 are of N-type conductivity type and transistor 26 is of P-type conductivity type. The drain of transistor 22 is connected to junction point 30 to which is applied a potential $V_{CC}$ which may equal in value the potential applied to the load and is generally derived from the same source as is applied to the load. The source of transistor 22 is connected to output point 32 to which is connected signal input point 42 of the bipolar circuit of Section 3. The drain of transistor 24 is connected to output point 32 and its source is connected to junction point 18. The conduction path of P-type transistor 26 is connected in parallel with that of transistor 22, transistor 26 having its source and drain electrodes connected to terminals 30 and 32 respectively. Transistors 22 and 26 may be viewed as a modified complementary transmission gate since they act to translate the $V_{CC}$ voltage level rather than a signal.

The gate electrodes of transistors 26 and 24 are connected in common to terminal 20 and the gate electrode of transistor 22 is connected to junction point 14.

The load 40 shown in Section 3 includes 2 transistors, 2 diodes, and 3 resistors. The cathode of diode D1 is connected to the load input signal point 42 which in turn is connected to the buffer output point 32. The anode of diode D1 is connected in common to the base of transistor Q1 and one end of resistor R1. The other end of resistor R1 is connected in common to the collector of transistor Q1 and to one end of resistor R2. The other end of resistor R2 is connected to terminal 30 to which $V_{CC}$ is applied. The emitter of transistor Q1 is connected to the anode of diode D2 which in turn feeds the base of transistor Q2. The collector of transistor Q2 is returned through R3 to terminal 30 and its emitter is connected to terminal 18 which is returned to ground potential.

The load 40 is a well known diode transistor logic (DTL) circuit and is used to illustrate some of the problems and requirements that must be satisfied at a typical FET load interface. Correct operation of the load requires that the input signal swing between the value of ground potential and the value of $V_{CC}$ potential. While it is important to clamp the input to either one of the two levels mentioned above, it must be noted that it would be incorrect to overdrive the input by applying thereto a signal going from ground to $+V_{DD}$. The reason is that values of $V_{DD}$ greater than 10 or 12 volts may cause reverse breakdown of the input diode causing irreparable damage to the load element. It is therefore of primary importance that in response to the input signals applied at terminal 20, the signal to the load element never be greater than the value of $V_{CC}$ volts.

Another requirement of the interface circuit is that it must be able to "sink" enough current to cause the load element to change states. This puts an upper limit on the value of the saturation resistance of transistor 24 when it is conducting. Analysis of the circuit shows that the conventional current flowing from terminal 42 into the transistor 24 (the current that is being "sunk") is determined by the value of R1, R2, the $V_{BE}$ of diode D1, and the saturation resistance of transistor 24.

If, for example, R1 and R2 are each equal to 3,000 ohms, the $V_{BE}$ of D1 is 0.8 volts, and $V_{CC}$ is equal to 6 volts, and it is desired that the base voltage of transistor Q1 be no greater than 1.3 volt, the maximum allowable saturation resistance of transistor 24 would be 200 ohms.

It is therefore required:

1. That the buffer output voltage swing between $V_{CC}$ and ground; and

2. That the output impedance of the buffer be low in order to be compatible with the load.

The magnitude of the problem alluded to above may now be comprehended. First, it has been found, for example, that in the present method of processing, the $V_T$ of N-type transistors varies from under 1 volt to nearly 3 volts and the $V_T$ of P-type devices varies from slightly above 1 volt to approximately 4 volts.

Secondly, the load may be fed from a power supply ($V_{CC}$) whose voltage level may vary over a wide range and whose lower voltage level may be less than 4 volts. The operation of the P-type device in such an environment is unreliable since the threshold voltage cannot be overcome. However, the replacement of the P-type device by an N-type device is also unreliable since such device will be operated in the source follower mode and its output will always be offset from the input.

These and other problems are solved by the circuit embodying the invention. Assume, by way of example, and only in order to best understand the embodiment set forth in the figure that P-type devices have a $V_T$ of 2 volts, that $V_{CC}$ varies between 4 and 6 volts and that $V_{DD}$ varies between 6 volts and 15 volts. It will be shown, in the discussion which follows, that the interface circuit acts to provide substantially the full $V_{CC}$ supply voltage to the load circuit over the full range of supply voltages and also acts as an impedance match.

Consider first the case of $V_{CC}$ equal to 4 volts and $V_{DD}$ equal to 6 volts. When the input signal at the input terminal 20 goes to ground, a potential zero volts is applied to the gate electrodes of transistors 12, 16, 24, and 26. As the gate and source electrodes of N-type transistors 16 and 24 are at the same potential, they are cutoff. Transistor 26 has its gate electrode connected to ground and its source electrode connected to $+V_{CC}$. Therefore, there is a forward bias of 4 volts between the gate and source of transistor 26. However, since the threshold voltage $V_T$ of transistor 26 is equal to 4 volts, it remains nonconducting and its conduction path is a high impedance.

P-type transistor 12 has its source electrode returned to $+V_{DD}$ volts and therefore it is forward biased by a $V_{GS}$ of 6 volts. Since transistor 12 is operated in the common source mode, it is highly conductive and applies $+V_{DD}$ volts to the gate of transistor 22.

Transistor 22 is operated in the source follower mode and has $+V_{CC}$ volts applied to its drain electrode. Considering transistor 22 by itself, the potential at its source electrode ($V_S$), which is connected to output point 32, will equal the lower of either [$V_G-V_T$], where $V_G$ is its gate voltage and $V_T$ is its threshold voltage, or $V_{CC}$ volts. Therefore, with $V_{CC}$ equal to 4 volts, $V_G$ equal to $V_{DD}$ equal to 6 volts, and $V_T$ equal to 2 volts, $V_S$ is equal to 4 volts and the potential at output point 32 is indeed substantially clamped to the $V_{CC}$ level. Thus, even though transistor 26 is cut off, $V_{CC}$ potential is applied to output point 32. Note that even where $V_{CC}$ lower than 4 volts, transistor 22 would tend to clamp output point 32 to $V_{CC}$ so long as $V_{DD}$ would be greater than $V_{CC}$ by 2 or more volts.

A second case may now be considered in which $V_{CC}$ is maintained at 4 volts but $V_{DD}$ is raised to 15 volts and the signal at terminal 20 is returned to ground potential. N-type transistors 16 and 24 are cut off as above and P-type transistor 26 also remains cut off as above since the potential applied between its gate and source is not greater than its $V_T$. Transistor 12 conducts heavily since it is now forward biased by a $V_{GS}$ of 15 volts, and, virtually the full 15 volts potential is applied to the gate of transistor 22. Transistor 22 is now forward biased by a 15 volt signal applied to its control (gate) electrode. However, regardless of the voltage at the gate, the maximum voltage that may appear at the source ($V_S$) will be substantially equal to $+V_{CC}$ for maximum $V_S$ is equal to the lower of either [$V_G-V_T$] or $V_{CC}$.

It might be mentioned, in passing, that the saturation resistance of IGFET devices decreases exponentially as a function of the applied forward bias. Thus, when a voltage of 15 volts is applied to its gate, the saturation resistance of transistor 22 will be slightly lower than when the gate potential is 6 volts. Therefore, increasing the forward bias due to an increase in the $V_{DD}$ supply only tends to couple more tightly the $V_{CC}$ power supply and the output point but never acts to overdrive the signal to the load.

It has been shown above that with $V_{CC}$ equal to 4 volts, the potential at the output point will be clamped to $V_{CC}$ regardless of whether $V_{DD}$ equals 6 or 15 volts. It will now be shown that when $V_{CC}$ is equal to 6 volts, the signal at the output of the interface circuit is clamped to +6 volts, though $V_{DD}$ varies from 6 to 15 volts.

Assume, for example, that $V_{DD}$ is equal to 6 volts and the signal at input terminal 20 is equal to zero. Transistors 16 and 24 are still cut off and transistor 12 conducts and applies $+V_{DD}$ to the gate of transistor 22. Transistor 22 thus has 6 volts applied to its drain and 6 volts applied to its gate. Since transistor 22 has a $V_T$ of 2 volts and is operated in the follower mode, the highest potential it can provide to terminal 32 is ($V_{DD}-V_T$) or 4 volts. However, transistor 26 now has 6 volts applied to its source electrode and ground to its gate electrode. Since its $V_{GS}$ (6 volts) is now greater than its $V_T$ (4 volts) transistor 26, which is operated in the common source mode, clamps the voltage at output point 32 to $+V_{CC}$.

It should be appreciated that whereas transistor 22 compensates for transistor 26 when $V_{CC}$ is equal to or less than 4 volts, transistor 26 compensates for transistor 22 when $V_{CC}$ is greater than 4 volts. It further should be noted that transistors 22 and 26 perform the equivalent of an unidirectionally conducting transmission gate in which $V_{CC}$ is the signal to be translated.

The fourth case in which $V_{CC}$ is equal to 6 volts, $V_{DD}$ is equal to 15 volts and the signal at input terminal 20 is returned to ground finds output point 32 more tightly clamped to $+V_{CC}$ than for any of the prior examples. Transistor 26 will be saturated as in the third case but in addition, transistor 22, as in the second case, has approximately 15 volts applied to its gate and will also tend to clamp output point 32 to $+V_{CC}$.

It has therefore been shown that for all the variations in power supply voltages, the potential at output point 32 is clamped to substantially $+V_{CC}$ volts for all ground potential signals applied at terminal 20.

When the signal at input terminal 20 goes "high" ($+V_{DD}$), transistors 12, 22, and 26 are cut off and transistors 16 and 24 are turned on. Since transistor 24 is always operated in the common source mode and the minimum voltage applied to its gate will be 6 volts (when $V_{DD}$=6 volts) and its $V_T$ is equal to 2 volts, transistor 24 will always be fully turned on when a positive input signal greater than 2 volts is applied to terminal 20. A final condition to be met is that the saturation resistance of transistor 24 be sufficiently low to "sink" the necessary current from the bipolar circuit. This is achieved by making the physical size of the transistor 24 sufficiently large to achieve the required "on" resistance.

The complementary inverter of Section 1, transistors 12 and 16, generates the complementary signals of $V_{DD}$ or ground amplitude which either enable transistors 22 and 26 to clamp output point 32 to $V_{CC}$ or enables transistor 24 to clamp output point 32 to ground.

The inverter of Section 1 need not be of the complementary type and may be either the output stage of an FET circuit which drives the clamping circuit comprising transistors 22, 24, and 26 or else an integral part of the buffer circuit.

As for the interconnection of Section 1 and Section 2 of the Buffer, the control electrodes of transistors 24 and 26 may be connected to the output point 14 and the control electrode of transistor 22 may be connected to input terminal 20 thus making the Buffer a noninverting rather than an inverting buffer.

The load has been illustrated using a DTL stage, but it should be obvious that any bipolar logic circuit as well as any load which requires current drive needs a buffer circuit to interface with the high output impedance of the typical FET circuit.

It should also be obvious that $V_{DD}$ and $V_{CC}$ represent voltage levels which may be generated by one or more power supplies.

What we claim is:

1. The combination comprising:

first, second, third junction points and an output point;

an inverter having an input terminal and an output terminal coupled between said first and second junction points;

first and second transistors of one conductivity type and a third transistor of second conductivity type; each transistor having first and second electrodes defining the ends of a conduction path and a control electrode;

means coupling the conduction path of said first and third transistors in parallel between said third junction point and said output point;

means coupling said second transistor between said output point and said second junction point; and means coupling the control electrodes of said second and third transistors in common to one of said input and output terminals of said inverter, and the control electrode of said first transistor to the other one of said input and output terminals of said inverter.

2. The combination as claimed in claim 1, wherein said transistors are insulated-gate field-effect transistors of the enhancement type and wherein said inverter is a complementary inverter.

3. The combination as claimed in claim 1, further including at least one source of potential to provide:

1. A reference potential to be applied to said second junction point;
2. A first voltage of given amplitude to be applied to said first junction point; and
3. A second voltage to be applied to said third junction point, said second voltage having a voltage level at most equal to said first voltage.

4. The combination as claimed in claim 3, further providing means for coupling a source of signal to said input of said inverter; said signal source providing signals having one of a first value substantially equal to said reference potential and a second value substantially equal in amplitude to said first voltage level;

in response to the application of said signals the signals at said output point take on one of a first and second value said first value being substantially equal to said reference potential and said second value being substantially equal in amplitude to said second voltage level.

5. The combination as claimed in claim 3, further providing means for coupling load means having a signal input point, and responsive to signals applied to said signal input point, to said output point; said load means also having two terminals for the application thereto of an operating potential wherein a potential equal to said second voltage is applied to one terminal and said reference potential is applied to the other of said two terminals.

6. The combination as claimed in claim 3, wherein said transistors are of the type that the voltage applied to the control electrode must exceed a given value defined as the threshold voltage before conduction can occur; and wherein the voltage level of said second voltage is variable and may have a lower limit whose value is below the value of the threshold voltage of said third transistor.

7. A Buffer circuit comprising:

first and second junction points and input and output points;

first and second transistors of one conductivity type and a third transistor of second conductivity type; each transistor having source and drain electrodes defining the ends of a conduction path and a control electrode;

means coupling the conduction paths of said first and third transistors in parallel between said first junction point and said output point to form a first clamping circuit;

means coupling said second transistor between said output point and said second junction point to form a second clamping circuit; and signal generating means responsive to input signals applied to said input point suitable to enable one of said first and second clamping circuits thereby clamping said output point to one of said first and second junction points.

8. The combination as claimed in claim 7, further providing a source of operating potential having first and reference voltage levels applied respectively to said first and second junction points; and wherein said input signals have an amplitude equal to or greater than said first voltage level with respect to said reference voltage.

9. The combination as claimed in claim 8, wherein said first transistor is operated in the source follower mode and wherein said second and third transistors are operated in the common source mode.

10. For use with a circuit which includes a load having an input terminal to which it is desired to apply a signal of an amplitude not greater than a first voltage and which includes a field-effect transistor driving circuit supplying a signal whose amplitude may exceed said first voltage, a buffer circuit comprising, in combination:

a first terminal at said first voltage and a second terminal at a point of reference potential;

an output point for connecting said load input terminal thereto;

a first clamping circuit, comprising a complementary transmission gate having first and second field-effect transistors of first and second conductivity type, respectively, whose conduction paths are connected in parallel, coupled between said first terminal and said output point, said first clamping circuit, when enabled, clamping said output point to said first voltage level;

a second clamping circuit coupled between said output point and said second terminal for clamping, when enabled, said output point to said reference potential; and means responsive to said signal from said driving circuit for enabling one of said first and second clamping circuits.

11. The combination as claimed in claim 10, wherein said second clamping circuit includes a third field-effect transistor of first conductivity type;

wherein each of said first, second, and third transistors has a control electrode and source and drain electrodes defining the ends of a conduction path;

wherein the conduction paths of said first and second transistors are connected in parallel between said first terminal and said output point; and wherein the conduction path of said third transistor is connected between said output point and said second terminal.

12. A circuit for applying to an output terminal one of two different voltage levels comprising, in combination:

a first terminal for receiving voltage at one of said levels;

a second terminal for receiving voltage at the other of said levels;

two transmission circuits connected in series between said first and second terminals, said output terminal being at the connection between said transmission circuits, said first transmission circuit comprising two conduction paths, in parallel, and said second transmission circuit comprising a single transmission path; and means responsive to an input signal in one voltage range for causing the two conduction paths in parallel to assume relatively high values of impedance and the single transmission path to assume a relatively low value of impedance, and responsive to an input signal in another voltage range for causing one, or the other, or both of the two conduction paths in parallel to assume a relatively low value of impedance, depending, in part, on the relative values of the input signal and said first voltage level, and the single transmission path to assume a relatively high value of impedance.

13. A circuit for applying to an output terminal one of two different voltage levels comprising, in combination:

a first terminal for receiving voltage at one level;

a second terminal for receiving voltage at a second level;

two transmission circuits connected in series between said first and second terminals, said output terminal being at the connection between said transmission circuits, said first transmission circuit comprising the conduction paths, in parallel, of first and second transistors of opposite conductivity type, and said second transmission circuit comprising the conduction path of a third transistor, said conduction paths being connected in the forward direction relative to said first and second voltage levels, and each said transistor including a control electrode to which a signal may be applied for controlling the conductivity of the conduction path of its transistor; and means responsive to an input signal in one range for applying signals to the control electrodes of said first and second transistors in a sense to cause their conduction paths to exhibit relatively high impedances and for applying a signal in the forward direction to the third transistor of an amplitude to cause its conduction path to assume a relatively low impedance, and responsive to an input signal in another range for applying signals in the forward direction to the control electrodes of said first and second transistors of an amplitude to cause at least one of the first and second paths to assume a relatively low value of impedance and applying a signal in the reverse direction to the third transistor for causing its conduction path to assume a relatively high impedance.

14. A circuit for applying to an output terminal one of two different voltage levels comprising, in combination:

a first terminal for receiving a voltage at one level;

a second terminal for receiving voltage at a second level;

two transmission circuits connected in series between said first and second terminals, said output terminal being at the connection between said transmission circuits, said first transmission circuit comprising the conduction paths in parallel of first and second transistors of opposite conductivity type, and said second transmission circuit comprising the conduction path of a third transistor, said conduction paths being connected in the forward direction relative to said first and second voltage levels; and means responsive to an input signal in one range for applying signals to the first and second transistors in a sense to drive them to cutoff and for applying a signal in the forward direction to the third transistor of an amplitude to cause its conduction path to assume a relatively low value of impedance, and responsive to an input signal in another range for applying signals in the forward direction to the first and second transistors of an amplitude to cause at least one of the first and second paths to assume a relatively low value of impedance and applying a signal in the reverse direction to the third transistor for driving it to cutoff.